United States Patent
Ho et al.

(10) Patent No.: US 7,387,484 B2
(45) Date of Patent: Jun. 17, 2008

(54) WAFER POSITIONING SYSTEMS AND METHODS THEREOF

(75) Inventors: Chih-Chien Ho, Tainan (TW); Jenn-Shiang Shieh, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 120 days.

(21) Appl. No.: 11/312,696

(22) Filed: Dec. 21, 2005

(65) Prior Publication Data
US 2007/0140826 A1 Jun. 21, 2007

(51) Int. Cl.
*B65G 49/07* (2006.01)
(52) U.S. Cl. ........................... 414/217; 414/939
(58) Field of Classification Search ............ 414/217, 414/939
See application file for complete search history.

(56) References Cited

U.S. PATENT DOCUMENTS

| | | | | |
|---|---|---|---|---|
| 4,744,713 A | * | 5/1988 | Hrovath | 414/222.02 |
| 4,836,733 A | * | 6/1989 | Hertel et al. | 414/744.5 |
| 5,435,683 A | * | 7/1995 | Oosawa et al. | 414/217 |
| 5,483,138 A | * | 1/1996 | Shmookler et al. | 318/568.16 |
| 5,740,034 A | * | 4/1998 | Saeki | 700/59 |
| 5,740,059 A | * | 4/1998 | Hirata et al. | 700/213 |
| 5,847,529 A | * | 12/1998 | Chao et al. | 318/568.21 |
| 5,980,194 A | * | 11/1999 | Freerks et al. | 414/754 |
| 6,040,585 A | * | 3/2000 | Hsiao | 250/559.4 |
| 6,246,923 B1 | * | 6/2001 | Sugimura et al. | 700/218 |
| 6,275,297 B1 | | 8/2001 | Zalicki | |
| 6,339,730 B1 | * | 1/2002 | Matsushima | 700/218 |
| 6,405,101 B1 | * | 6/2002 | Johanson et al. | 700/218 |
| 6,438,460 B1 | * | 8/2002 | Bacchi et al. | 700/275 |
| 6,522,942 B2 | * | 2/2003 | Kondo et al. | 700/218 |
| 6,549,825 B2 | * | 4/2003 | Kurata | 700/245 |
| 6,671,576 B1 | * | 12/2003 | Chen | 700/218 |
| 6,690,986 B1 | * | 2/2004 | Mitchell et al. | 700/112 |
| 2006/0263177 A1 | * | 11/2006 | Meulen | 414/217 |
| 2007/0071581 A1 | * | 3/2007 | Gilchrist et al. | 414/217 |

* cited by examiner

*Primary Examiner*—James Keenan
(74) *Attorney, Agent, or Firm*—Birch, Stewart, Kolasch & Birch, LLP (57) ABSTRACT

An wafer positioning system comprises a wafer handling chamber with a vacuum sealable opening catching wafers. At least one processing chamber disposed adjacent to the wafer handling chamber has an opening catching wafers, sealed with a gate. A wafer transfer robot with a tray disposed in the wafer handling chamber transports wafers into the processing chambers. A signal receiver is disposed on the front end of the tray. When the tray passes below a wafer, the signal receiver detects wafer position, generating a wafer position signal. A control module receives the wafer position signal through the signal receiver and compares the wafer position signal with a predetermined position signal to correct any misalignment of the wafer.

13 Claims, 7 Drawing Sheets

WAFER POSITIONING SYSTEMS AND METHODS THEREOF

BACKGROUND OF THE INVENTION

1. Field of the Invention

The invention relates to wafer positioning systems, and in particular to an on-line wafer positioning system having signal receiver to detect wafer position.

2. Brief Discussion of the Related Art

Semiconductor manufacturing processes include processes such as oxidation, diffusion, lithography, etching, CVD, and others. To integrate related processes in a single system and process and transfer wafers quickly in a vacuum environment avoiding contamination, automatic semiconductor manufacturing equipment is critical.

Figure 1:
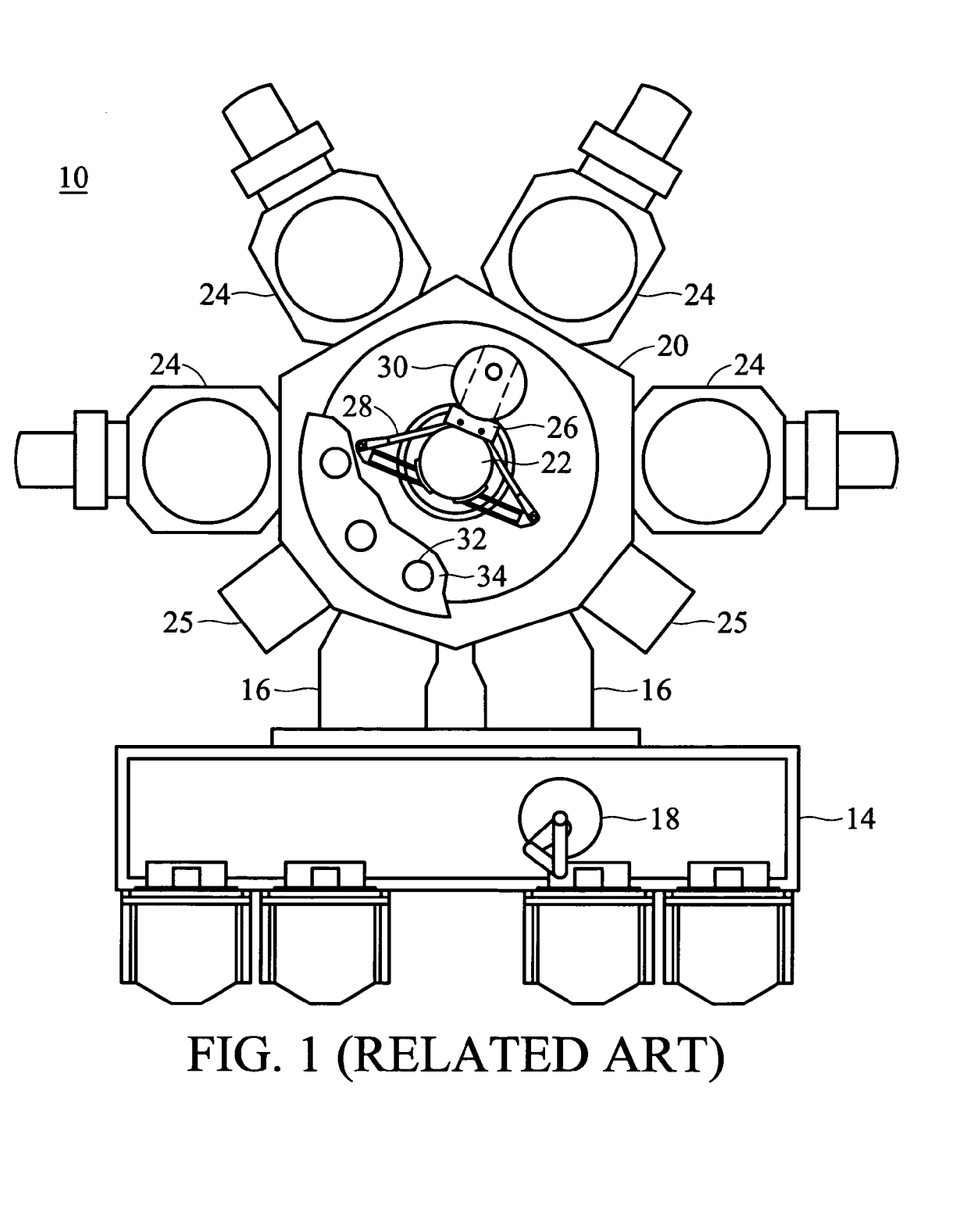
FIG. 1 is a diagram of a conventional multi-process chamber.

Multi-process chambers require less space, have a shortened production period, and consume less vacuum system resources. A general multi-process chamber design, as shown in FIG. 1, comprises a front end wafer handling chamber 14 connecting the transfer system of the factory and transferring wafer carriers to a load lock chamber 16 via robots 18. Further, a wafer handling chamber 20 is disposed in the center of the machine, in which a wafer transfer apparatus 22 is disposed and further comprises a wafer transfer robot 28. Outside the wafer handling chamber 20, a plurality of processing chambers 24 and cooling chambers 25 are disposed to load/unload wafers. The wafer transfer robot 28 is controlled by optical detection through a position point 32 of a position stage 34 (only partially shown). Moreover, through the wafer transfer robot 28, wafers 30 can be moved from the load lock chamber 16 to the processing chambers 24 to execute various processes or from the processing chambers 24 to the cooling chambers 25 to be cooled.

Wafers 30 are supported by a tray 26 and move between processing chambers 24 by the wafer transfer robot 28 in the wafer handling chamber 20. Due to mechanical loss, the wafer transfer robot 28, however, may cause displacement of the wafer position and is incapable of accurate, wafer positioning in the processing chambers. Such displacement may create process instability and malfunction of the vacuum clamp head. Due to the vacuum state of the wafer handling chamber, the machine must stop product processing and break vacuum to conduct the maintenance, interrupting production and possibly damaging wafers. Furthermore, if horizontally mis-positioned, the wafer transfer robot 28 may lose horizontal stability, thus generating vibration, further damaging wafers and the wafer carrier.

U.S. Pat. No. 6,275,297 discloses a system and method of wafer position detection on a wafer transfer robot. A transparent area is disposed above the transfer channel between the wafer handling chamber and the processing chamber. Utilizing an optical sensor and a reflective device disposed on the wafer transfer robot to determine the distance between the wafer and the edge of the tray of the wafer transfer robot, wafer position accuracy can be determined. In a conventional system, however, only relative wafer position can be detected.

SUMMARY OF THE INVENTION

Further, it is impossible to determine whether the abnormality is a result of mechanical loss or simple mis-positioning. Thus, when the control unit corrects the movement of the wafer transfer robot in accordance with the bias of the wafer position, wafers can still be mis-positioned due to inaccurate correction of the wafer transfer robot.

SUMMARY

An wafer positioning system comprises a wafer handling chamber with a vacuum sealable opening catching wafers. At least one processing chamber disposed adjacent to the wafer handling chamber has an opening catching wafers, sealed with a gate. A wafer transfer robot with a tray disposed in the wafer handling chamber transports wafers into the processing chambers. A signal receiver is disposed on the front end of the tray. When the tray passes below a wafer, the signal receiver detects wafer position, generating a wafer position signal. A control module receives the wafer position signal through the signal receiver and compares the wafer position signal with a predetermined position signal to correct any misalignment of the wafer.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Figure 2A:
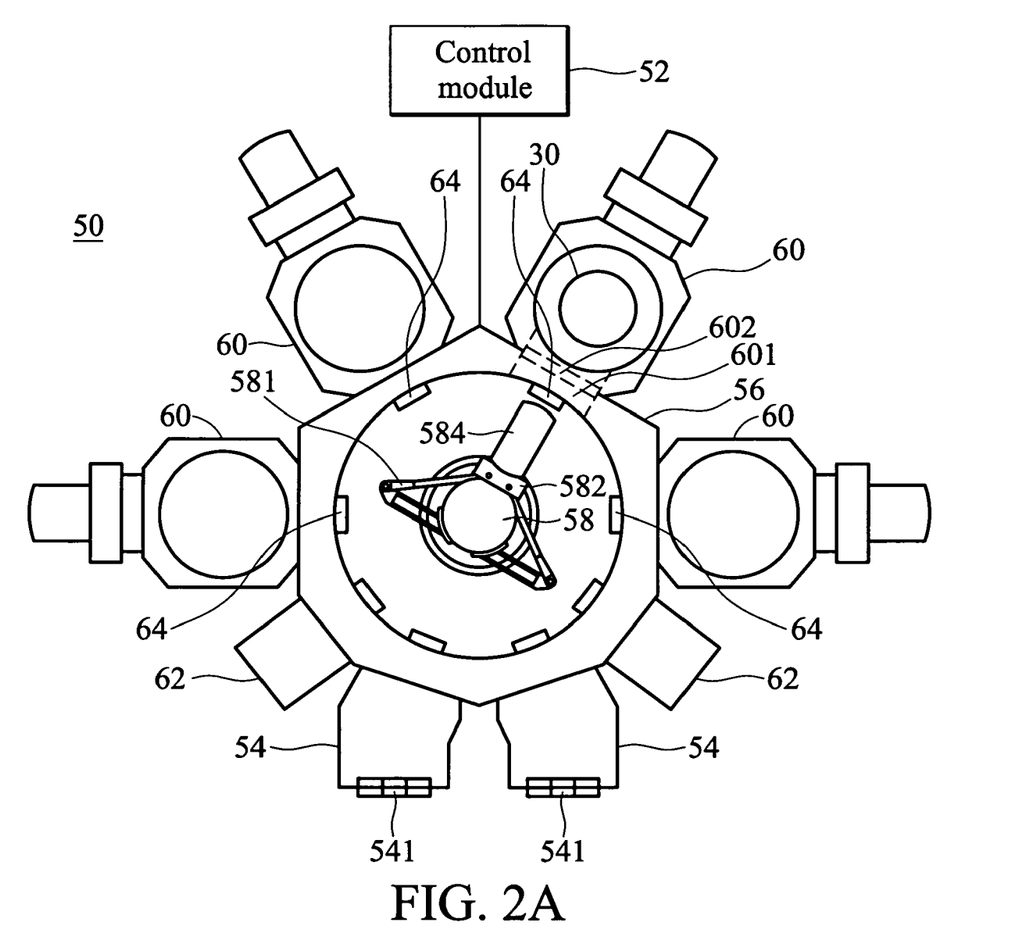
FIG. 2A is a diagram of a wafer positioning system.
Figure 2B:
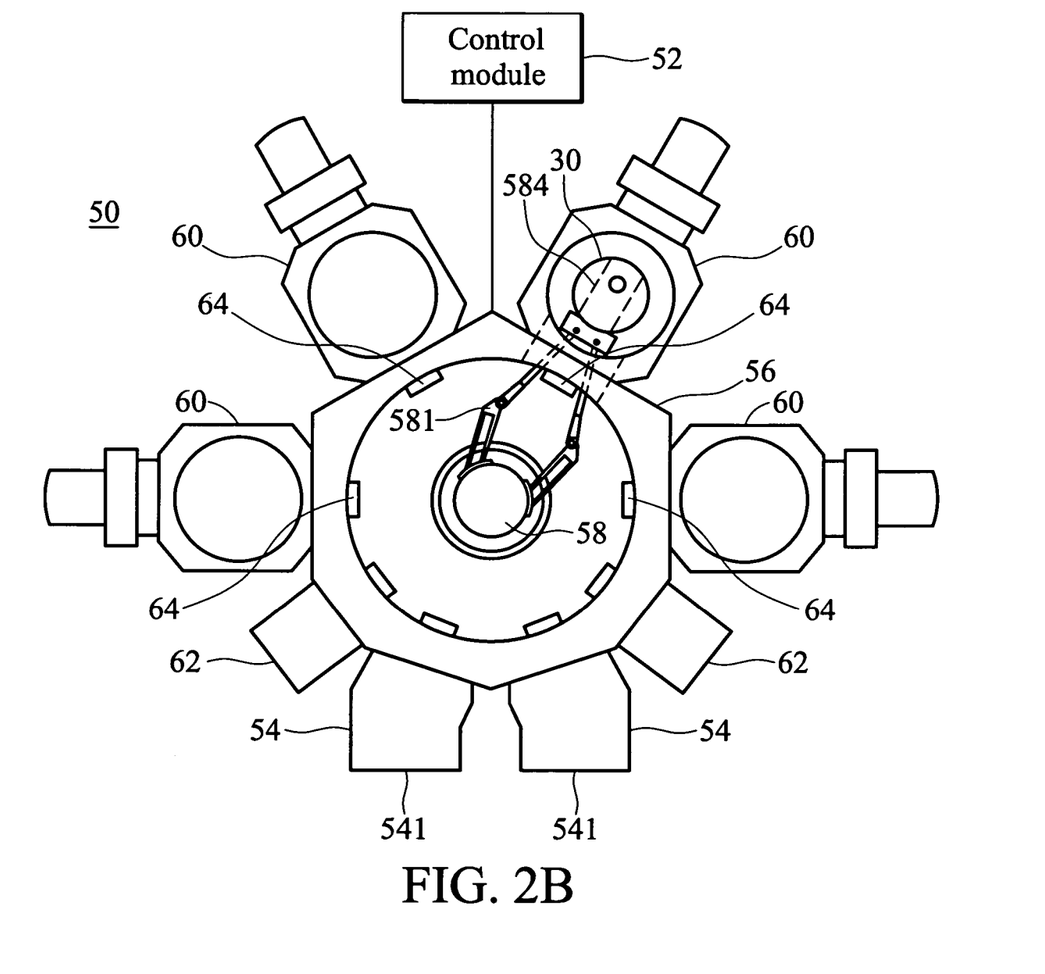
FIG. 2B is a diagram of a wafer transfer robot of the system described in FIG. 2A catching a wafer.

FIG. 2A is a diagram of a wafer positioning system and FIG. 2B shows a wafer transfer robot thereof catching a wafer. To simplify figures, a multi-process chamber 50 is shown in FIG. 2A & FIG. 2B without the front end wafer handling chamber and the wafer transfer robot in FIG. 1.

As shown in FIG. 2A & FIG. 2B, a multi-process chamber 50 comprises a wafer handling chamber 56 connected to the exterior via a vacuum chamber 54, sealed by a shutter 541. Outside the wafer handling chamber 56, a plurality of processing chambers 60 and cooling chambers 62 are disposed, each comprising a passage 601 and a gate 602. A wafer 30 enters the processing chamber 60 through the passage 601 and the gate 602 closes the passage 601. A wafer transfer robot 58, disposed to deliver the wafer 30, comprises a sub robot 581, a connection portion 582, and a tray 584 bearing the wafer 30. A control module 52 controls the system, e.g. the movement of the wafer transfer robot 58 and the process parameters of the processing chamber. Additionally, in this embodiment of the multi-process chamber 50, a plurality of planar mirrors 64 are disposed above the passage 601, connecting the wafer handling chamber 56, the processing chamber 60, the cooling chambers 62, and the vacuum chamber 54, to calibrate the transfer system.

As shown in FIG. 2A, when the wafer 30 possess a process such as dry etching, CVD, or RTP, and the gate 602 is open, the wafer transfer robot 58 aligns with the processing chamber 60, in preparation to remove the wafer 30. As shown in FIG. 2B, when moving from the retracted state to the processing chamber 60, the wafer transfer robot 58 sequentially passes below the planar mirror 64, the passage 601, and the wafer 30. When the tray 584 is positioned, an apparatus (not shown) introduced to support the wafer 30 inside the processing chamber 60 withdraws to stably seat the wafer 30 on the tray 584. The wafer transfer robot 58 retracts and prepares to deliver the wafer 30 to the next processing chamber 60 or target.

The multi-process machine 50 of the invention provides wafer positioning by disposing a signal emitter and a signal receiver on the front end, whereby when the tray 584 passes below the planar mirror 64 and the wafer 30, the signal receiver receives light from the signal emitter reflected by the planar mirrors 64 and the wafer 30, forming two position signals. The control module 52 compares these signals with the predetermined position signals to determine whether the wafer 30 is accurately positioned.

Figure 3A:
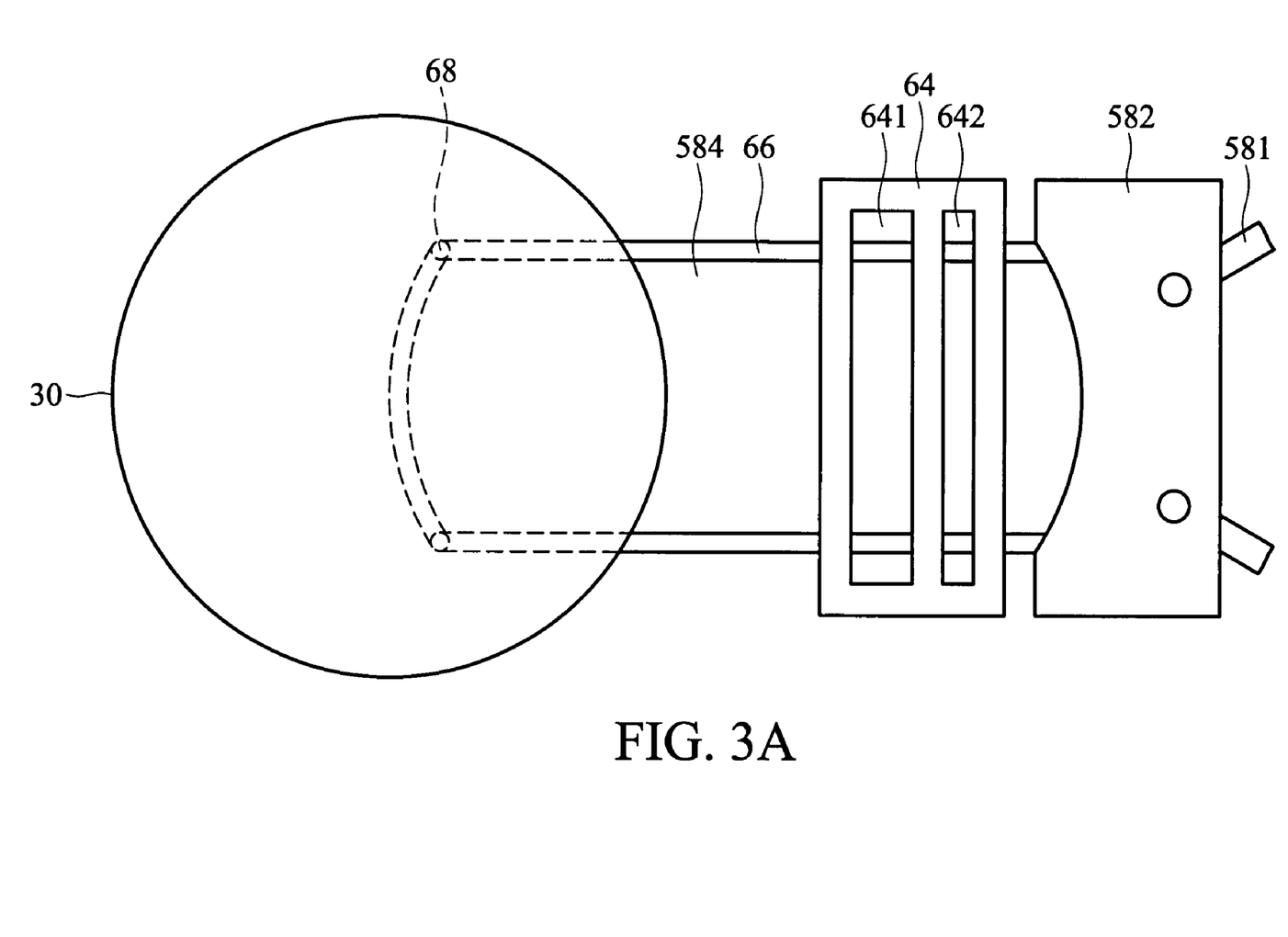
FIG. 3A is a top view of a wafer transfer robot, catching a wafer, of the wafer positioning system.
Figure 3B:
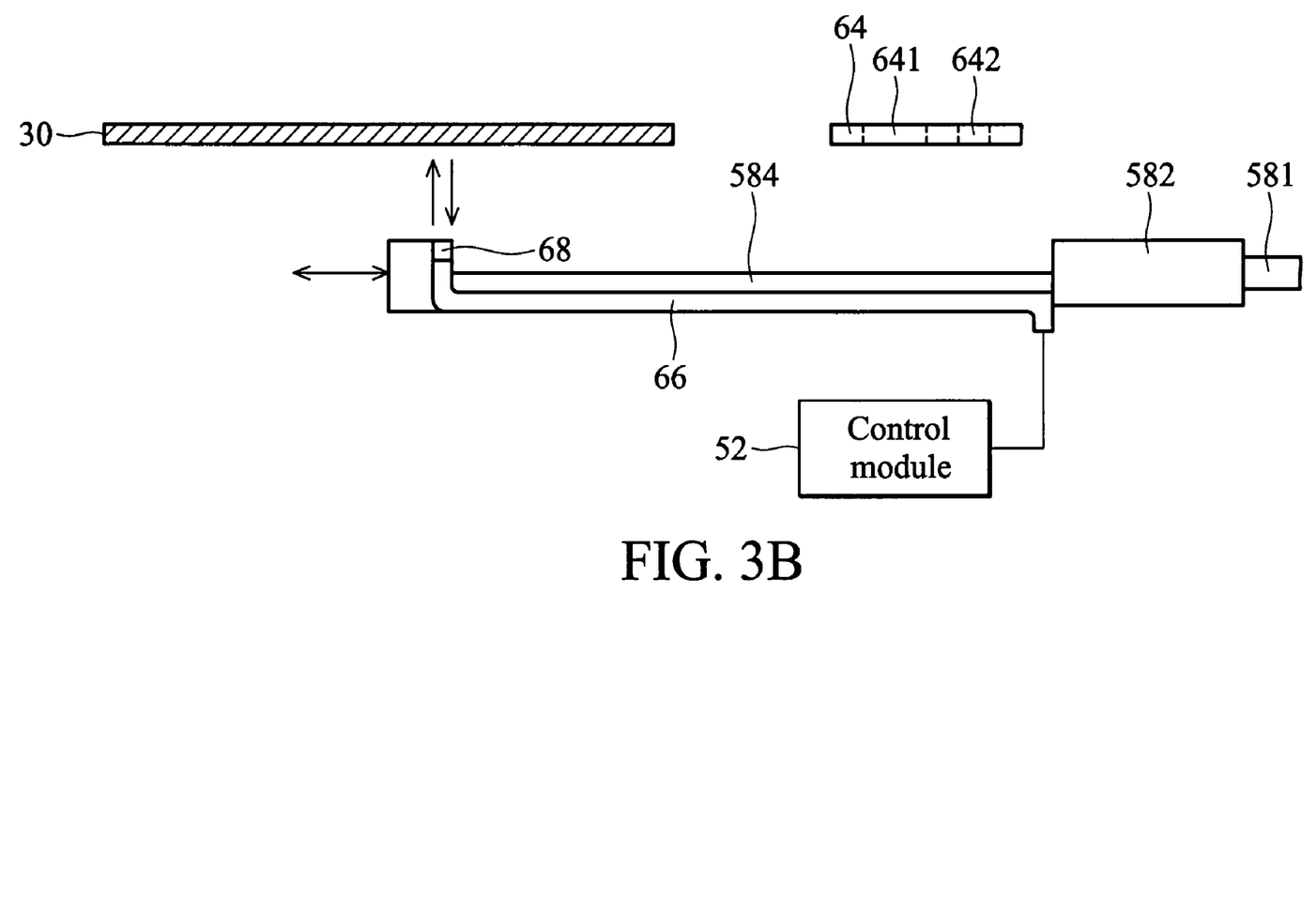
FIG. 3B is a side view of a wafer transfer robot, catching a wafer, of the wafer positioning system.

The mentioned signal emitter and signal receiver as disclosed are preferably reflective fiber sensors 66 such as Keyence FS-V20 or FU-32. Referring to FIG. 3A & FIG. 3B, the fibers of the two reflective fiber sensors 66 can be disposed along the edge of the tray 584 of the wafer transfer robot 58. The emitter 68 of the sensor is fixed on both sides of the front end of the tray 584 and the emitter 68 emits a predetermined wavelength upward. When the wafer transfer robot 58 enters the processing chamber, the tray 584 sequentially passes below the planar mirror 64 and the wafer 30, and the reflective fiber sensor 66 receives the light reflected by the planar mirrors 64 and the wafer 30, enabling light intensity of the sensor 66 to change. Further, by comparing the predetermined position signal and the received position signal, the control module 52 determines whether the wafer transfer robot 58 is operating properly and whether the wafer 30 is normally positioned. To increase light intensity of the reflective fiber sensor, as shown in FIG. 3A, the planar mirror 64 comprises two rectangular holes 641, 642 of different widths, sequentially disposed.

Figure 4:
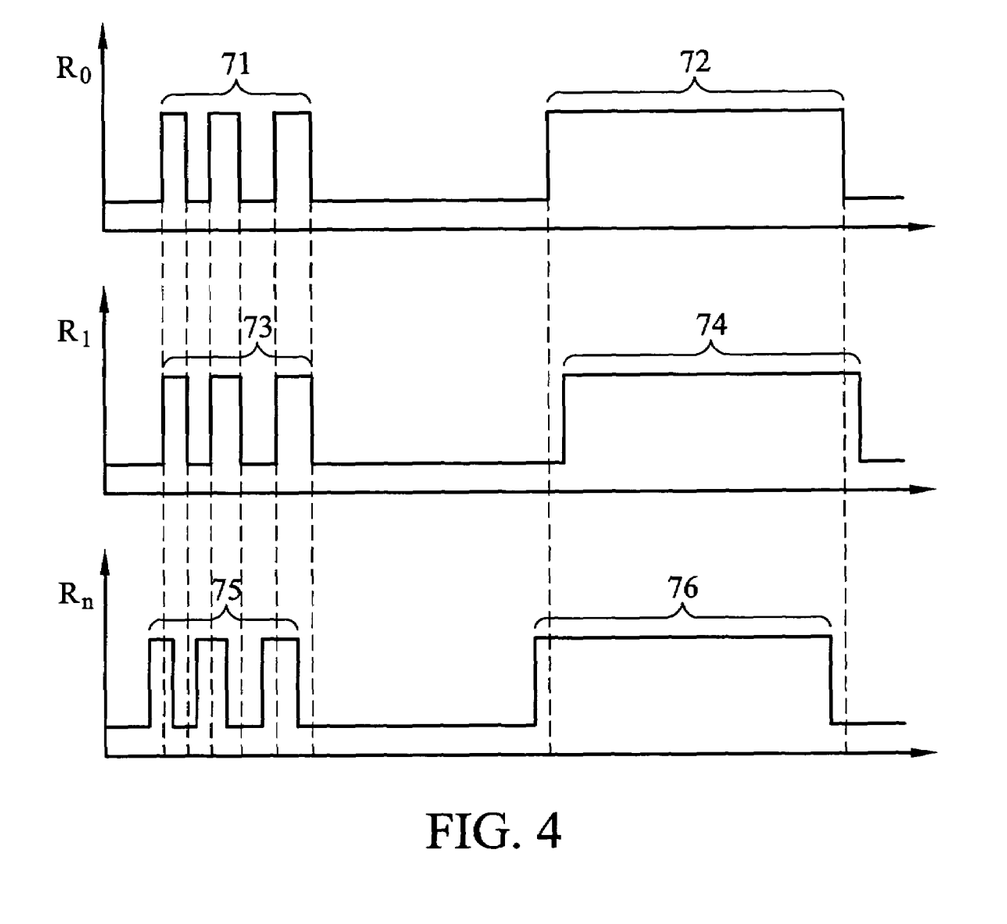
FIG. 4 is a diagram of the position signal of the signal receiver of the wafer positioning system.

FIG. 4 is a diagram of the position signal of the signal receiver of the wafer positioning system. Referring to FIG. 3B & FIG. 4, the control module 52 of the invention comprises a predetermined calibration signal 71 and a predetermined position signal 72 measured from normal operation of the wafer transfer robot 58. When the wafer 30 located in the processing chamber is mis-positioned and the wafer transfer robot 58 is operating normally, the predetermined calibration signal 71 and the calibration signal 73 received by the reflective fiber sensor 66 will be consistent, but the wafer position signal 74 will experience a position shift from the predetermined position signal 72. Additionally, the control module 52 can calculate the accurate planar position of the wafer 30 through the wafer position signal 74 measured by two reflective fiber sensors 66, further determining the position shift between the wafer 30 and the tray 584. Thus, the control module 52 can correct successive movements of the wafer transfer robot 58 in accordance with the position shift and control the wafer transfer robot 58 to precisely deliver the wafer 30 to the next position.

When the wafer transfer robot 58 is not normally positioned due to mechanical or other malfunction, as shown in Rn of FIG. 4, the calibration signal 75 experiences a position shift from the predetermined calibration signal 71. If the position shift is beyond an allowable range, the wafer transfer robot 58 is determined to be abnormal and the system is stopped processing and recalibrated to avoid damage to wafer 30 or other apparatus.

Figure 5:
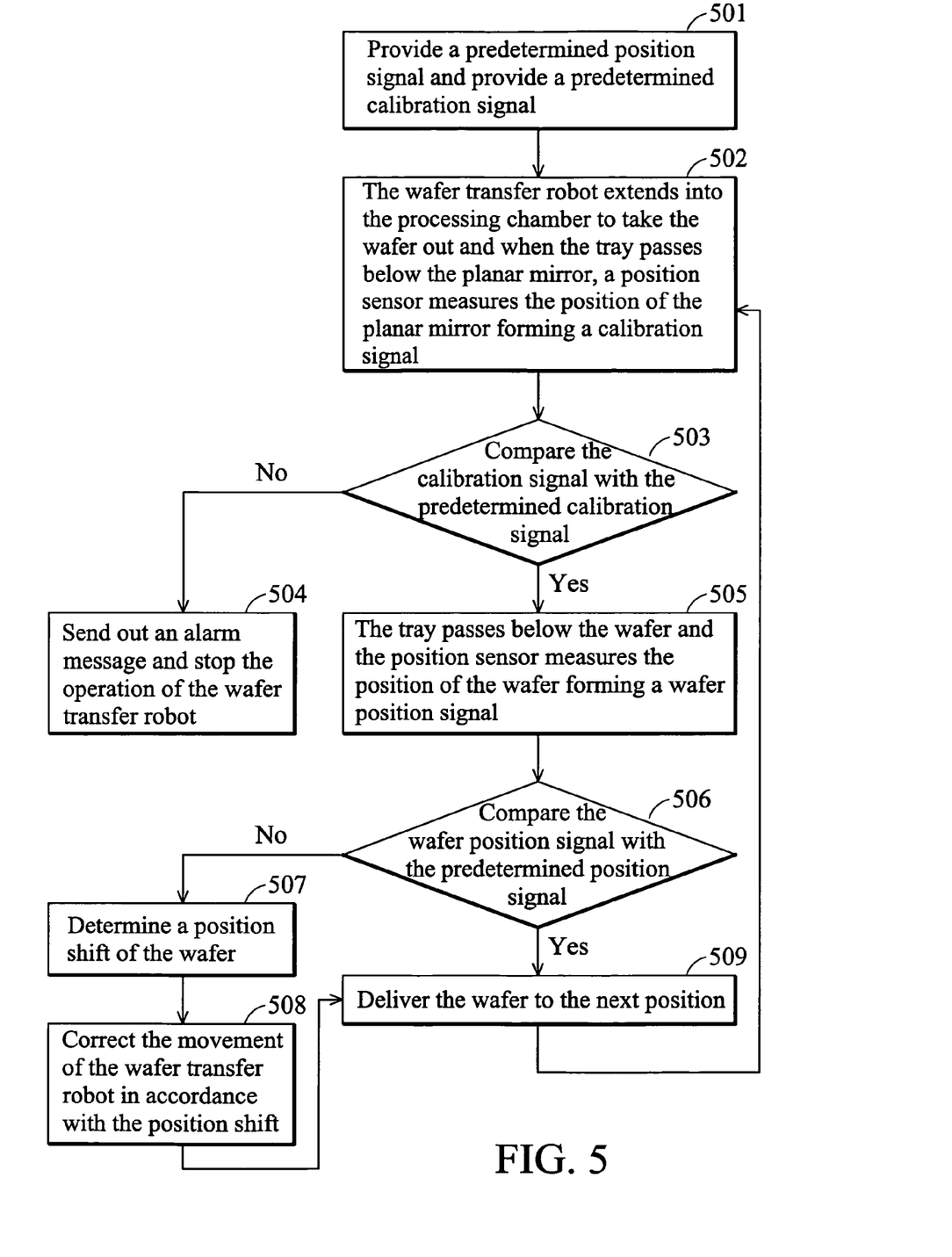
FIG. 5 is a flowchart of a wafer positioning method.

FIG. 5 is a flowchart of a wafer positioning method. In a wafer positioning method of the invention, a predetermined position signal 72 and a predetermined calibration signal 71 are provided after calibrating the system (S501). Under normal operation, the wafer transfer robot 58 delivers the wafer 30 to the processing chamber 60. When processing is complete, the wafer transfer robot 58 extends to the processing chamber 60, removing the wafer 30, and when the tray 584 passes below the planar mirror 64, a signal receiver 66 measures the position of the planar mirror 64, generating a calibration signal (S502). Control module 52 further compares the calibration signal with the predetermined calibration signal (S503) and if the calibration signal is not consistent with the predetermined calibration signal and beyond an allowable range, the control module 52 sends an alarm message and stops both the operation of the wafer transfer robot 58 and the system (S504). If the calibration signal is consistent with the predetermined calibration signal, the wafer transfer robot 58 is operating normally. When the tray 584 passes below the wafer 30, the signal receiver 66 measures the position of the wafer 30, generating a wafer position signal (S505). The control module 52 compares the wafer position signal with the predetermined position signal (S506). If the wafer position signal is consistent with the predetermined position signal 72, the control module 52 does not correct the movement of the wafer transfer robot 58 and directly processes the next target position and repeats the cycle (S509). If the wafer position signal is inconsistent with the predetermined position signal 72, the control module 52 determines a position shift of the wafer 30 in accordance with the wafer position signal (S507) and corrects the next movement of the wafer transfer robot 58 in accordance with the position shift (S508). The wafer transfer robot 58 precisely delivers the wafer 30 to the position of next processing chamber 60 (S509).

The wafer positioning system of the invention utilizes a signal receiver disposed on the front end of the wafer transfer robot. Additionally, the control module obtains information on the wafer transfer robot in the wafer handling chamber, determining whether the wafer position is accurate. If the wafer position is abnormal, the control module corrects the transfer movement of the wafer to maintain the wafer in the required position without stopping product processing and breaking the vacuum for maintenance. Thus, maintenance time of the machine is extended.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A wafer positioning system, comprising:
   a wafer handling chamber having a shutter through which a wafer is introduced into the wafer handling chamber;

a plurality of processing chambers disposed adjacent to the wafer handling chamber, each having an opening and a gate, wherein the openings allow the wafer to enter the processing chambers and the gates close the openings;

a wafer transfer robot disposed in the wafer handling chamber for transferring the wafer into the processing chambers, wherein the wafer transfer robot has a tray supporting the wafer;

a signal emitter disposed on a front end of the tray;

a signal receiver disposed on the front end of the tray, —whereby the signal receiver receives the signal emitted from the signal emitter and outputs a wafer position signal;

a control module electrically connected to the signal receiver, determining whether the wafer is in a predetermined position via the wafer position signal; and a plurality of planar mirrors disposed on the side walls above the openings between the wafer handling chamber and the processing chambers to reflect the light emitted from the signal emitter, wherein the planar mirrors have a plurality of holes.

2. The system as claimed in claim 1, wherein the signal emitter is a light emitting diode.

3. The system as claimed in claim 1, wherein the signal emitter and the signal receiver are reflective fiber sensors.

4. The system as claimed in claim 1, wherein the control module compares a predetermined position signal with the wafer position signal to determine a position shift between the tray and the wafer.

5. The system as claimed in claim 4, wherein when the tray supports the wafer for transfer to the processing chambers, the control module corrects movement of the wafer transfer robot in accordance with the position shift, enabling the wafer to be precisely positioned in the processing chambers.

6. The system as claimed in claim 1, wherein the holes are sequentially disposed along the path from the wafer transfer robot to the processing chambers.

7. The system as claimed in claim 1, wherein when the wafer transfer robot extends radially to send the wafer into the processing chambers, the signal receiver receives the light emitted from the signal emitter and reflected by the planar mirrors, outputting a calibration signal.

8. The system as claimed in claim 7, wherein the control module has a predetermined calibration signal and wherein when the predetermined calibration signal is different from the calibration signal, the control module stops operation of the wafer transfer robot.

9. A wafer positioning system, comprising;

a wafer handling chamber having a shutter, through which a wafer is introduced into the wafer handling chamber;

a plurality of processing chambers disposed adjacent to the wafer handling chamber, each having an opening and a gate, wherein the openings allow the wafer to enter the processing chambers and the gates close the openings;

a wafer transfer robot disposed in the wafer handling chamber for transferring the wafer into the processing chambers, wherein the wafer transfer robot has a tray supporting the wafer;

a plurality of planar mirrors disposed on side walls above the openings between the wafer handling chamber and the processing chambers, wherein the planar mirrors have a plurality of holes;

a signal emitter disposed on a front end of the tray, emitting a light of a predetermined wavelength;

a signal receiver disposed on the front end of the tray, wherein when the wafer transfer robot extends radially and the tray passes below the wafer, the signal receiver receives the light emitted from the signal emitter and reflected by the planar mirrors and outputs a calibration signal; and a control module electrically connected to the signal receiver, determining whether the wafer transfer robot is in a predetermined position via the calibration signal.

10. The system as claimed in claim 9, wherein the signal emitter is a light emitting diode.

11. The system as claimed in claim 9, wherein the signal emitter and the signal receiver are reflective fiber sensors.

12. The system as claimed in claim 9, wherein the holes are sequentially disposed along the path from the wafer transfer robot to the processing chambers.

13. The system as claimed in claim 9, wherein the control module has a predetermined calibration signal and wherein when the predetermined calibration signal is different from the calibration signal, the control module stops operation of the wafer transfer robot.

* * * * *